(12) United States Patent
Chinthakindi et al.

(10) Patent No.: US 7,701,037 B2
(45) Date of Patent: Apr. 20, 2010

(54) ORIENTATION-INDEPENDENT MULTI-LAYER BEOL CAPACITOR

(75) Inventors: Anil K. Chinthakindi, Haymarket, VA (US); Eric Thompson, Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 157 days.

(21) Appl. No.: 11/831,208

(22) Filed: Jul. 31, 2007

(65) Prior Publication Data

US 2009/0032904 A1    Feb. 5, 2009

(51) Int. Cl.
    *H01L 29/00* (2006.01)
(52) U.S. Cl. .................... 257/532; 257/E21.01
(58) Field of Classification Search ......... 257/E21.008, 257/E27.048, E21.647, 296–313, 533, 595–602, 257/923–924, E27.198; 438/317
    See application file for complete search history.

(56) References Cited

U.S. PATENT DOCUMENTS

| | | | |
|---|---|---|---|
| 5,583,359 A | 12/1996 | Ng et al. | |
| 6,525,427 B1 | 2/2003 | Duncombe et al. | |
| 6,677,637 B2 | 1/2004 | Bernstein et al. | |
| 6,777,809 B2 | 8/2004 | Duncombe et al. | |
| 6,800,941 B2 | 10/2004 | Lee et al. | |
| 6,882,015 B2 | 4/2005 | Bernstein et al. | |
| 6,992,344 B2* | 1/2006 | Coolbaugh et al. | 257/301 |
| 7,195,971 B2 | 3/2007 | Bernstein et al. | |
| 2007/0126078 A1* | 6/2007 | Huang et al. | 257/532 |
| 2007/0170429 A1* | 7/2007 | Miyazawa | 257/59 |

OTHER PUBLICATIONS

"Optimization of Metal-Metal Comb-Capacitors for RF Applications", Haris Basit, Jay Rajagopalan, 4 Pages.
"Copper-Based Chips", Wikipedia, [online]; [retrieved on May 9, 2007]; retrieved from the Internet http://en.wikipedia.org/wiki/Copper-Based_chips, Mar. 8, 2007, 2 Pages.

* cited by examiner

*Primary Examiner*—Wai-Sing Louie
*Assistant Examiner*—Sue Tang
(74) *Attorney, Agent, or Firm*—Cantor Colburn LLP; Katherine Brown

(57) ABSTRACT

A plurality of interdigitized conductive fingers are arranged to form a substantially square configuration in each of a plurality of layers separated by a high dielectric constant material, wherein each of the plurality of interdigitized conductive fingers includes at least one bend of substantially ninety degrees. The plurality of interdigitized conductive fingers includes a first set of fingers that are connected to an anode terminal, and a second set of fingers that are connected to a cathode terminal. The plurality of layers includes a bottommost layer that is in closest proximity to a substrate relative to other layers of the plurality of layers. The bottommost layer does not include any fingers connected to the anode terminal.

8 Claims, 3 Drawing Sheets

ORIENTATION-INDEPENDENT MULTI-LAYER BEOL CAPACITOR

BACKGROUND OF THE INVENTION

1. Field of the Invention

This invention relates to microelectronic capacitors and, more particularly, to capacitors formed using back-end-of-the-line (BEOL) processes.

2. Description of Background

Capacitors are employed to implement any of a wide variety of functions within electronic circuits. These include resonant circuits, filters, voltage-controlled oscillators, coupling between amplifier stages, and bypassing. Microelectronic capacitors are often fabricated as part of a back-end-of-the-line (BEOL) process. BEOL refers to integrated circuit fabrication steps where components such as transistors, resistors, and diodes are interconnected with wiring on a semiconductor wafer. More specifically, BEOL begins when a first layer of metal is deposited on the wafer. BEOL includes contacts, insulator, metal levels, and bonding sites for chip-to-package connections.

Some characteristics by which capacitors are evaluated include capacitive density, parasitic capacitance to ground, and the extent to which one or more functional parameters are influenced by device orientation. Existing BEOL capacitors have several shortcomings. In a standard BEOL comb capacitor, the device is not symmetric in both directions, leading to orientation-dependent operation, undesired parasitic capacitances, and circuit mismatches. The asymmetric topology can also lead to increased area requirements. Moreover, existing BEOL capacitors have an undesirably large parasitic capacitance associated with the bottommost layers of the capacitor anode coupling to the semiconductor substrate.

SUMMARY OF THE INVENTION

The shortcomings of the prior art are overcome and additional advantages are provided by using a plurality of interdigitized conductive fingers arranged to form a substantially square configuration in each of a plurality of layers separated by a high dielectric constant material, wherein each of the plurality of interdigitized conductive fingers includes at least one bend of substantially ninety degrees. The plurality of interdigitized conductive fingers includes a first set of fingers that are connected to an anode terminal, and a second set of fingers that are connected to a cathode terminal. The plurality of layers includes a bottommost layer that is in closest proximity to a substrate relative to other layers of the plurality of layers. The bottommost layer does not include any fingers connected to the anode terminal.

Multi-layer capacitors using interdigitized fingers with ninety degree bends provide increased capacitive density by eliminating the need for conductive connecting tabs on the fingers. A layer of the capacitor closest to the substrate does not include any fingers connected to the anode terminal of the capacitor so as to eliminate or reduce electric field coupling to the substrate and parasitic capacitance resulting therefrom.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

DETAILED DESCRIPTION OF THE INVENTION

Figure 1:
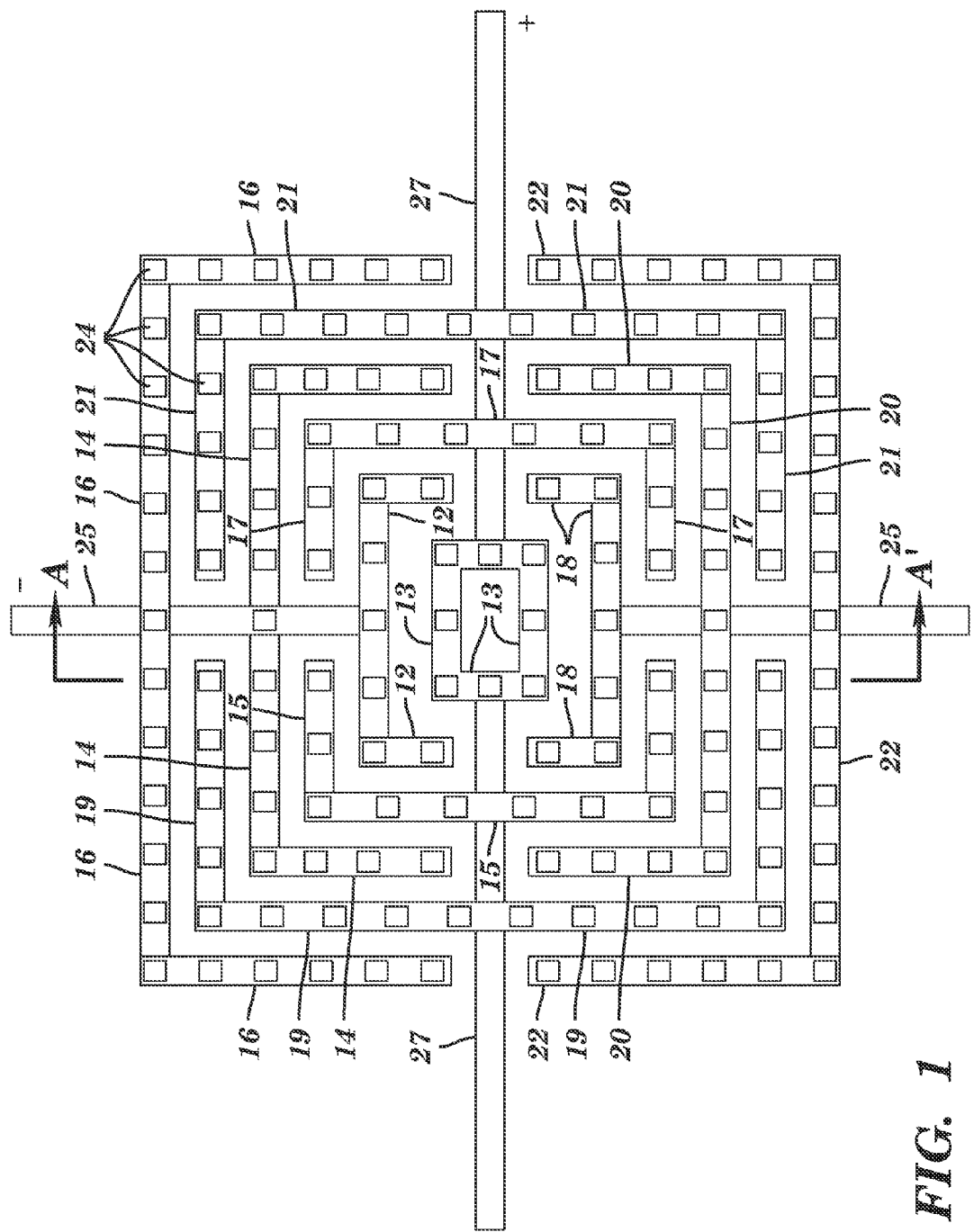
FIG. 1 illustrates one example of an orientation-independent, multi-layer BEOL capacitor.

Turning now to the drawings in greater detail, it will be seen that FIG. 1 sets forth one example of an orientation-independent, multi-layer BEOL capacitor illustrated as a plan view in a top-down perspective. A plurality of interdigitized conductive fingers 12, 13, 14, 15, 16, 17, 18, 19, 20, 21, 22 are arranged to form a substantially square configuration in each of a plurality of layers. FIG. 1 depicts a single layer, with additional layers shown in FIG. 3 and to be described in greater detail hereinafter. Illustratively, each of the layers may, but need not, be fabricated of a low dielectric insulator layer, with the conductive fingers formed, for example, using a low resistance conductive material, and each of the layers being separated, for example, by a high dielectric constant material. Examples of high dielectric constant materials include tantalum pentoxide and silicon nitride, whereas illustrative low dielectric constant materials include fluorinated glass, aerogel, silk, or hydrogen silsesquioxane (HSQ). The conductive material could include aluminum, copper, or any of various other materials. In the case of copper, a damascene BEOL process could be utilized.

Each of the plurality of interdigitized conductive fingers 12, 13, 14, 15, 16, 17, 18, 19, 20, 21, 22 includes at least one bend of substantially ninety degrees. The plurality of interdigitized conductive fingers includes a first set of fingers 12, 14, 16, 18, 20, 22 that are connected to a cathode terminal 25, and a second set of fingers 13, 15, 17, 19, 21 that are connected to an anode terminal 27. Interdigitized conductive fingers 12, 13, 14, 15, 16, 17, 18, 19, 20, 21, 22 could, but need not, include one or more pass-through vias 24 for connecting a conductive finger on a first layer to a conductive finger on a second layer. The plurality of layers includes a bottommost layer that is in closest proximity to a substrate relative to other layers of the plurality of layers. The bottommost layer does not include any fingers connected to anode terminal 27.

Figure 2:
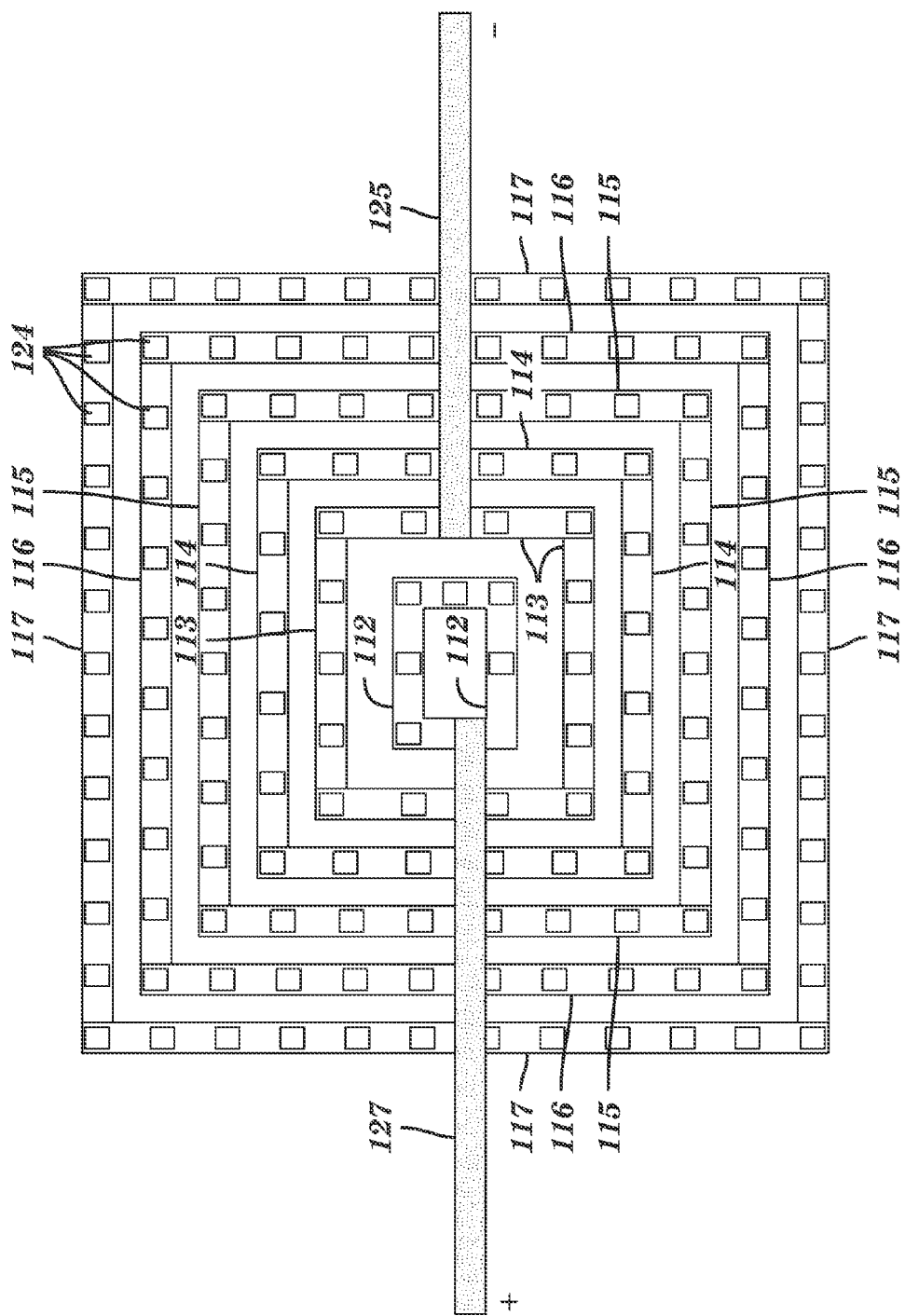
FIG. 2 illustrates another example of an orientation-independent, multi-layer BEOL capacitor.

FIG. 2 sets forth another example of an orientation-independent, multi-layer BEOL capacitor illustrated as a plan view in a top-down perspective. A plurality of interdigitized conductive fingers 112, 113, 114, 115, 116, and 117 are arranged to form a substantially square configuration in each of a plurality of layers. FIG. 2 depicts a single layer, with additional layers shown in FIG. 3 and to be described in greater detail hereinafter. As discussed previously in conjunction with FIG. 1, each of these layers may, but need not, be fabricated of a low dielectric insulator layer, with the conductive fingers formed, for example, using a low resistance conductive material, and each of the layers being separated, for example, by a high dielectric constant material.

Each of the plurality of interdigitized conductive fingers 112, 113, 114, 115, 116, and 117 (FIG. 2) includes at least one bend of substantially ninety degrees. For example, the configuration shown in FIG. 2 uses conductive fingers 112, 113, 114, 115, 116, and 117 each having four bends and formed into a series of concentric squares. The plurality of interdigitized conductive fingers includes a first set of fingers 112, 114, 116 that are connected to an anode terminal 127, and a second set of fingers 113, 115, 117 that are connected to a cathode terminal 125. Interdigitized conductive fingers 112, 113, 114, 115, 116, and 117 could, but need not, include one or more pass-through vias 124 for connecting a conductive finger on a first layer to a conductive finger on a second layer. The plurality of layers includes a bottommost layer that is in closest proximity to a substrate relative to other layers of the plurality of layers. The bottommost layer does not include any fingers connected to anode terminal 127.

Figure 3:
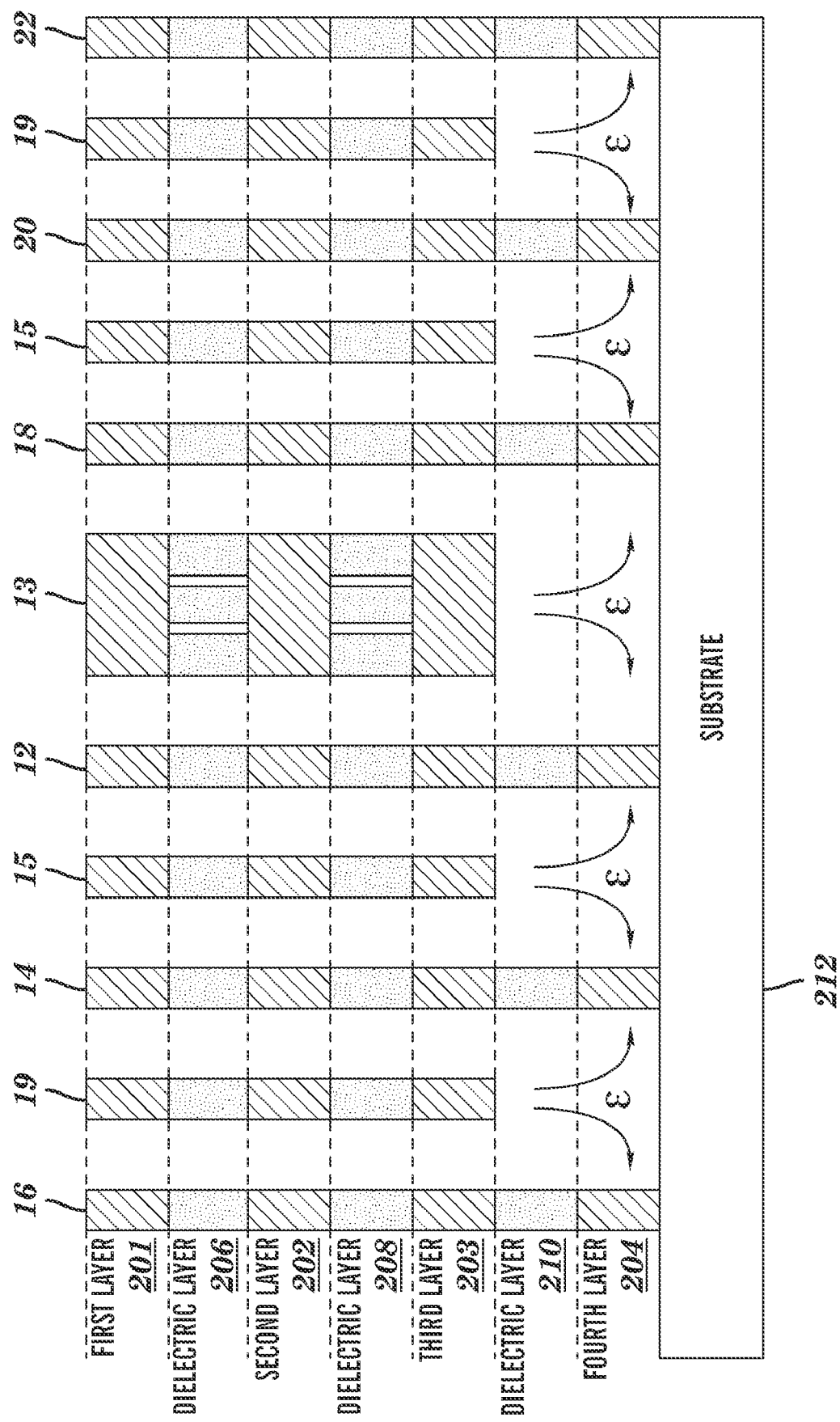
FIG. 3 illustrates a cross-sectional view of the capacitor of FIG. 1 taken along axis A-A'.

FIG. 3 illustrates a cross-sectional view of the capacitor of FIG. 1 taken along axis A-A'. A first layer 201 includes interdigitized conductive fingers 16, 19, 14, 15, 12, 13, 18, 15, 20, 19, and 22. Fingers 12, 14, 16, 18, 20 and 22 are connected to cathode terminal 25 (FIG. 1), whereas fingers 13, 15, 17, 19, and 21 (FIG. 3) are connected to anode terminal 27 (FIG. 1). Below first layer 201 is a dielectric layer 206. Below dielectric layer 206 is a second layer 202. Second layer 202 includes a set of interdigitized conductive fingers which are substantially identical to interdigitized conductive fingers 16, 19, 14, 15, 12, 13, 18, 15, 20, 19, and 22 in first layer 201 and depicted in the single-layer structure of FIG. 1.

Below second layer 202 (FIG. 3) is a dielectric layer 208. Below dielectric layer 208 is a third layer 203. Third layer 203 includes a set of interdigitized conductive fingers which are substantially identical to interdigitized conductive fingers 16, 19, 14, 15, 12, 13, 18, 15, 20, 19, and 22 in first layer 201 and depicted in the single-layer structure of FIG. 1. Below third layer 203 (FIG. 3) is a dielectric layer 210. Below dielectric layer 210 is a fourth layer 203.

Fourth layer 204 is in closest proximity to a substrate 212 relative to first, second, and third layers 201, 202, and 203, respectively. Fourth layer 204 includes a set of cathode-connected interdigitized conductive fingers which are substantially identical to interdigitized conductive fingers 16, 14, 12, 18, 20, and 22 (FIG. 1) of first layer 201, and which are connected to cathode terminal 25. However, fourth layer 204 (FIG. 3) does not include any digitized fingers which are connected to anode terminal 27 (FIG. 1). This feature is provided to reduce or eliminate parasitic capacitance caused by anode elements coupling to substrate 212 (FIG. 3).

The electric fields resulting from elimination of anode elements in the bottommost layer closest to substrate 212 (i.e., fourth layer 204) are graphically depicted in FIG. 3. Observe that these electric fields terminate at fingers connected to cathode terminal 25 (FIG. 1) instead of entering substrate 212 (FIG. 3). With prior art BEOL capacitor designs, these electric fields would substantially encroach upon substrate 212, thereby causing undesirable parasitic capacitances. Since the electric fields of prior art designs exit the body of the capacitor and enter the substrate, this results in a condition whereby the electrical properties of the capacitor are dependent upon the physical orientation of the capacitor. By contrast, the capacitor design concepts illustrated in FIG. 3 show that, by substantially preventing the electric field from exiting the capacitor and entering the substrate, the electrical properties of the capacitor remain substantially unchanged regardless of the physical orientation of the capacitor.

First, second, third, and fourth layers 201, 202, 203, 204 may, but need not, be fabricated of a low dielectric insulator layer such as fluorinated glass, aerogel, silk, hydrogen silsesquioxane (HSQ), another low dielectric insulator material, or any of various combinations thereof. Conductive fingers 16, 19, 14, 15, 12, 13, 18, 15, 20, 19, and 22 may, but need not, be formed of a low resistance conductive material such as aluminum, copper, or any of various other materials. In the case of copper, a damascene BEOL process could be utilized. Dielectric layers 206, 208, and 210 separating first, second, third and fourth layers 201, 202, 203, 204 may, but need not, be fabricated of a high dielectric constant material such as tantalum pentoxide, silicon nitride, or any of various other high dielectric constant materials.

While this invention has been described with reference to specific embodiments, the description of the specific embodiments is illustrative only and is not to be considered as limiting the scope of the invention. Various other modifications and changes may occur to those skilled in the art without departing from the spirit and scope of the invention.

What is claimed is:

1. A multi-layered capacitor comprising:
a plurality of interdigitized conductive fingers forming a substantially square configuration in a plurality of layers separated by a high dielectric constant material, wherein the plurality of interdigitized conductive fingers includes at least one bend of substantially ninety degrees; a first set of fingers that are connected to an anode terminal; and a second set of fingers that are connected to a cathode terminal; and wherein the plurality of layers includes a bottommost layer that is in closest proximity to a substrate relative to other layers of the plurality of layers, wherein the bottommost layer includes the second set of fingers connected to the cathode terminal, but does not include any fingers connected to the anode terminal such that an electric field emitted from the first set of fingers above the bottommost layer are diverted from entering the substrate by the second set of fingers located in the bottommost layer.

2. The multi-layered capacitor of claim 1 wherein each of the layers is fabricated of a low dielectric constant material.

3. The multi-layered capacitor of claim 1 wherein the conductive fingers are formed using a low resistance conductive material comprising one or more metals or metal-containing alloys.

4. The multi-layered capacitor of claim 1 wherein each layer of the plurality of layers is separated from at least one other layer of the plurality of layers by a high dielectric constant material.

5. The multi-layered capacitor of claim 4 wherein the high dielectric constant material includes at least one of tantalum pentoxide and silicon nitride.

6. The multi-layered capacitor of claim 2 wherein the low dielectric constant material includes at least one of fluorinated glass, aerogel, silk, or hydrogen silsesquioxane (HSQ).

7. The multi-layered capacitor of claim 3 wherein the low-resistance conductive material includes at least one of aluminum or copper.

8. The multi-layered capacitor of claim 7 wherein the low-resistance conductive material comprises copper provided by a damascene BEOL process.

* * * * *